United States Patent [19]

Hammer

[11] Patent Number: 5,070,508
[45] Date of Patent: Dec. 3, 1991

[54] SEMICONDUCTOR LASER WITH ADJUSTABLE LIGHT BEAM

[75] Inventor: Jacob M. Hammer, Princeton Borough, N.J.

[73] Assignee: General Electric Company, Schenectady, N.Y.

[21] Appl. No.: 860,447

[22] Filed: May 7, 1986

[51] Int. Cl.$^5$ .............................................. H01S 3/98
[52] U.S. Cl. .......................................... 372/44; 372/18
[58] Field of Search ................ 372/44, 48, 18; 357/17

[56] References Cited

U.S. PATENT DOCUMENTS

| | | | |
|---|---|---|---|
| 4,101,845 | 7/1978 | Russer | 331/94.5 |
| 4,156,206 | 5/1979 | Comerford et al. | 331/94.5 |
| 4,280,106 | 7/1981 | Scifres et al. | 331/94.5 |
| 4,347,586 | 8/1982 | Botez | 372/46 |
| 4,385,389 | 5/1983 | Botez | 372/48 |
| 4,399,542 | 8/1983 | Kawanishi | 372/47 |
| 4,462,658 | 7/1984 | Scifres et al. | 350/96.14 |
| 4,468,772 | 8/1984 | Oudar | 372/8 |
| 4,499,437 | 2/1985 | Blazey | 332/7.51 |
| 4,631,729 | 12/1986 | Goodwin et al. | 372/44 |
| 4,641,311 | 2/1987 | Ackley | 372/48 X |

*Primary Examiner*—Mark Hellner
*Attorney, Agent, or Firm*—Allen L. Limberg; James C. Davis, Jr.; Marvin Snyder

[57] ABSTRACT

A laser device includes a substrate of semiconductor material having a major surface and a pair of opposed side surfaces. A plurality of laser elements are on the major surface of the substrate and are arranged in a plurality of spaced rows. Each laser element has an active region in which radiation is generated and which extends substantially parallel to the major surface of the substrate and between the side surfaces. Each row can contain either a single laser element or a plurality of laser elements which are optically coupled along the row. A waveguide extends from each end of each row of laser elements toward an adjacent side surface of the substrate. The waveguides are optically coupled to optically couple the laser elements in the rows in series so as to injection lock in phase the laser elements. Means are provided for emitting the radiation from one of the surfaces of the substrate. The radiation may be emitted from the waveguides at one of the side surfaces or reflectors may be provided on the major surface adjacent the laser elements for emitting beams of radiation from the major surface. Phase shifters are provided adjacent the laser elements for adjusting the phase of the radiation generated in the laser elements and thereby adjust in the far field the interference pattern formed by the emitted beams of radiation.

22 Claims, 2 Drawing Sheets

SEMICONDUCTOR LASER WITH ADJUSTABLE LIGHT BEAM

The Government has rights in this invention pursuant to a Government Contract.

The present invention relates to a semiconductor laser device in which the emitted light beam is adjustable. More particular, the present invention relates to a semiconductor laser device which emits a plurality of beams the phase of which can be adjusted to provide a far field which has an interference pattern which can be adjusted.

BACKGROUND OF THE INVENTION

There have been developed semiconductor laser devices which emit a beam of light having a substantially single lobe. For example, U.S. Pat. No. 4,347,486 to D. Botez issued Aug. 31, 1982 entitled "Single Filament Semiconductor Laser With Large Emitting Area", shows one such type of laser. Also, arrays of semiconductor lasers have been formed in a single substrate to provide a beam of light of increased intensity. U.S. Pat. No. 4,385,389 to D. Botez, issued May 24, 1983 entitled "Phase-Locked CDH-LOC Injection Laser Array" shows one such type of array. However, there are many applications for semiconductor laser devices that provide in the far field an interference pattern of coherent beams of light which can be adjusted.

SUMMARY OF THE INVENTION

A semiconductor laser device includes a substrate of semiconductor material having a major surface. A plurality of laser elements are in spaced relation along the major surface of the substrate with each of the laser elements having a region which is substantially parallel to the major surface in which region light is generated. The laser elements are optically coupled in series along the major surface of the substrate so as to injection lock the phases of all of the laser elements to each other. The substrate includes means for emitting a beam of at least some of the radiation generated from the laser elements from a surface of the substrate. The substrate also includes means for varying the phase of the radiation generated in at least one of the laser elements.

DETAILED DESCRIPTION OF PREFERRED EMBODIMENTS

Figure 1:
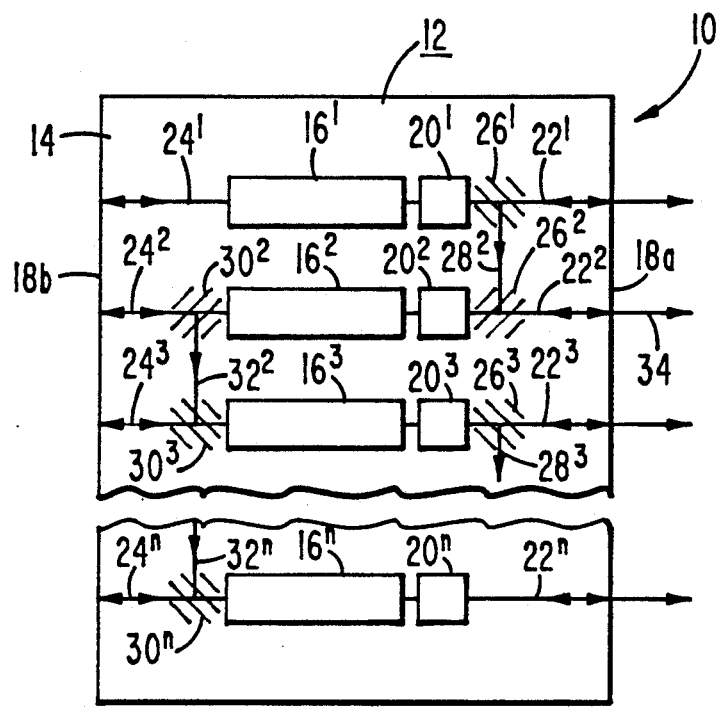
FIG. 1 is a schematic view of one form of the semiconductor laser device of the present invention for steering light in one direction.

Referring initially to FIG. 1, a form of a semiconductor laser device incorporating the present invention to permit adjusting the far field pattern of emitted beams of light in one direction is generally designated as 10. Laser device 10 includes a substrate 12 of a semiconductor material having a major surface 14. On the surface 14 are a plurality of semiconductor laser elements $16^1$, $16^2$, $16^3$ ... $16^n$ which are arranged in spaced parallel relation. As will be explained in greater detail later, each of the semiconductor laser elements 16 includes an optical cavity in which light is generated and which extends substantially parallel to the major surface 14 of the substrate 12 between the ends of the laser device. The ends of each laser element 16 face opposite side edges $18a$ and $18b$ of the substrate 12.

Phase shifting elements $20^1$, $20^2$, $20^3$ ... $20^n$ are on the substrate surface 12 with each phase shifting element being adjacent an end of a separate one of the laser elements 16. As shown, each of the phase shifting elements 20 is adjacent the end of its respective semiconductor laser element 16 which faces the side edge $18a$ of the substrate 12. As will be explained in detail, each phase shifting element 20 has an optical waveguide which is in alignment with and is optically coupled to the cavity of its respective semiconductor laser element 16. Waveguides $22^1$, $22^2$, $22^3$ ... $22^n$ extend along the substrate surface 14 from each of the phase shifting elements $20^1$, $20^2$, $20^3$ ... $20^n$ respectively to the side edge $18a$ of the substrate 12. Waveguides $24^1$, $24^2$, $24^3$ ... $24^n$ extend along the substrate surface 14 from the other ends of the laser devices $16^1$, $16^2$, $16^3$ ... $16^n$ respectively to the side edge $18b$ of the substrate 12.

In each of the waveguides 22, except for the last waveguide $22^n$, and adjacent the respective phase shifting element 20 is a corner reflector $26^1$, $26^2$, $26^3$, etc. Each of the corner reflectors 26 is designed to allow some of the light emitted from the adjacent phase shifting element 20 to pass therethrough along the waveguide 22 to the edge $18a$ but to reflect some of the emitted light through 90° toward the adjacent waveguide 22. Thus, the corner reflector $26^1$ reflects some of the light from the phase shifting element $20^1$ along a waveguide $28^1$ to the corner reflector $26^2$ which reflects the light through 90° into the phase shift element $20^2$ and the laser element $16^2$. The corner reflector $26^2$ also allows some of the light emitted from the laser element $16^2$ to pass therethrough to the side edge $18a$ but reflects some of the light through 90° to the corner reflector $26^1$ which reflects the light into the laser element $16^1$. The corner reflector $26^3$ allows some of the light from the laser device $16^3$ to pass therethrough to the side edge $18a$ and reflects some of the light through 90° into the waveguide $28^3$ so that the light passes to the next adjacent waveguide, not shown. The corner reflector $26^3$ also reflects the light passing along the waveguide $28^3$ from the next adjacent waveguide into the laser element $16^3$.

Each of the waveguides 24, except the first waveguide $24^1$, contains a corner reflector $30^2$, $30^3$ ... $30^n$. Each of the reflectors 30 allows some of the light emitted from its adjacent laser element 16 to pass therethrough to the adjacent edge $18b$ of the substrate 12 but reflects some of the light through 90° toward a next adjacent waveguide 24. The reflector $30^2$ reflects some of the light from the laser device $16^2$ into a waveguide $32^2$ which extends along the substrate surface 14 between the waveguide $24^2$ and $24^3$. The corner reflector $30^3$ reflects the light from the waveguide $32^2$ through 90° into the laser element $16^3$. The reflector $30^3$ also reflects some of the light emitted from the laser element $16^3$ through 90° into the waveguide $32^2$ which light is reflected by the reflector $30^2$ into the laser element $16^2$. The reflector $30^n$ reflects light from the waveguide $32^n$ into the laser element $16^n$. The reflector $30^n$ also reflects some of the light from the laser element $16^n$ into the waveguide $32^n$ which passes along the waveguide $32^n$ to the next adjacent waveguide. Thus, the laser elements 16 are all optically connected in series by the waveguides 22, 24, 28, and 32, and the corner reflectors 26 and 30. The corner reflectors 26 and 30 may be Bragg gratings or other structures for changing the direction of the light, such as waveguide directional couplers and bends.

In the operation of the laser device 10, each of the semiconductor laser elements 16 generates light in its internal cavity which light is emitted from both ends of the laser element 16 and flows along the waveguides 22 and 24 to the side edges 18a and 18b of the substrate 12. The side edges 18a and 18b are reflective so that they reflect the light back into the laser element 16. This provides an optical cavity which generates substantially coherent light. The side edge 18a is partially transparent so that some of the coherent light is emitted therefrom as a beam 34. In addition, a portion of the light generated by the laser element 16, which may be approximately 5%, is deflected by the reflectors 26 and 30 to adjacent laser elements 16 so as to optically couple all of the laser elements 16 in series. In this way all of the laser elements 16 are injection locked in phase to each other. Since the laser elements 16 are locked in phase to each other, the beam of light 34 emitted from the laser device 10 will have a far field which is the interference pattern of the coherent waves emitted by the laser elements. Since the light beam 34 is made up of light from a plurality of the laser elements 16, it will be of a relatively high power. By electrically operating one or more of the phase shifters 20, the laser elements 16 may be made to operate in the same phase to produce an interference pattern consisting of substantially one dominant mode. Other phase relations among the laser elements can be used to change the far field as desired. Thus, the laser device 10 will provide a beam of light having a relatively high power and a far field pattern which can be adjusted.

Figure 2:
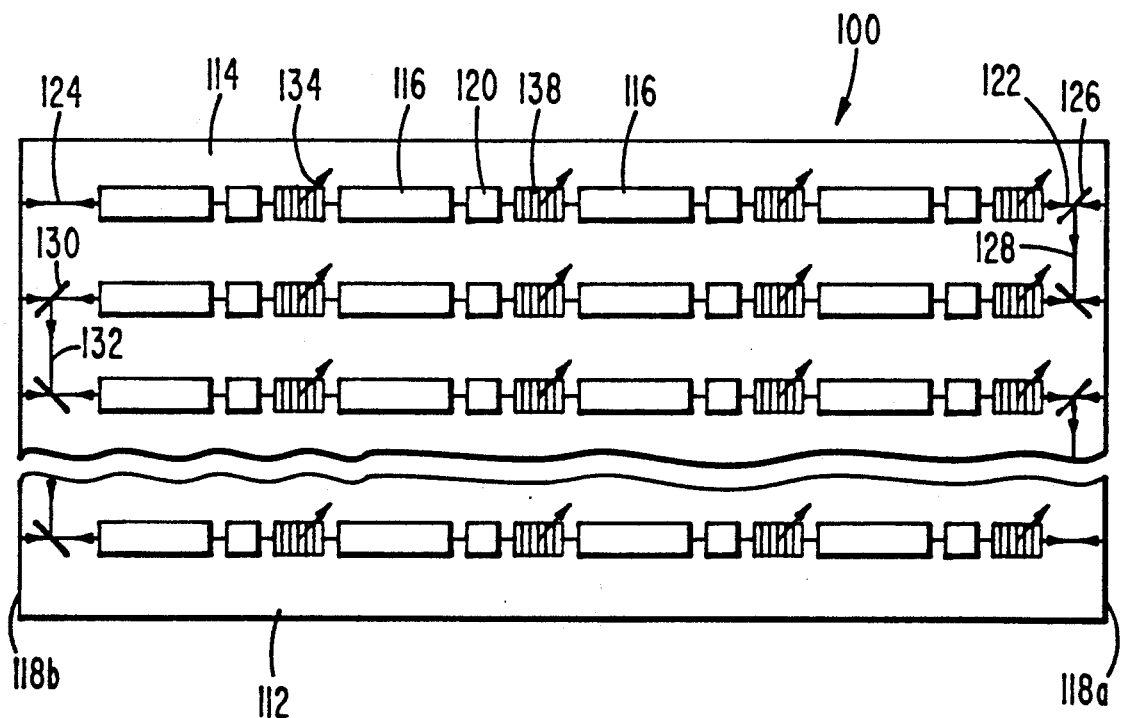
FIG. 2 is a perspective view of a portion of the device shown in FIG. 1.

Referring to FIG. 2, a modification of the laser device of the present invention, which provides a beam which is adjustable in two directions, is generally designated as 100. The laser device 100 includes a substrate 112 of a semiconductor material having a major surface 114 and opposed side edge surfaces 118a and 118b. A plurality of semiconductor laser elements 116 are on the substrate surface 114 and are arranged in a plurality of rows with each row containing a plurality of the laser elements 116. Each of the laser elements 116 contains an optical cavity which extends substantially parallel to the substrate surface 114 between the ends of the laser elements 116. The optical cavities of all of the laser elements 116 in each row are in alignment with their longitudinal axis being substantially perpendicular to the side edges 118a and 118b of the substrate 112.

The laser elements 116 in each row are optically coupled together and a separate waveguide 122 extends from one end of each row to the side edge 118a of the substrate 112 and a separate waveguide 124 extends from the other end of each row of laser elements to the side edge 118b of the substrate 112. As in the laser device 10 shown in FIG. 1, the rows of laser elements 116 are optically connected in series by waveguides 128 which extend between the waveguides 122 of alternate pairs of the rows, corner reflectors 126 in the waveguides 122 at the ends of the waveguides 128, waveguides 132 extending between adjacent pairs of waveguides 124 at the other ends of the rows, and corner reflectors 130 in the waveguides 124 at the ends of the waveguides 132. The corner reflectors 126 and 130 allow most of the light flowing along the waveguides 122 and 124 respectively to pass therethrough to the side edges 118a and 118b respectively but reflect a small portion of the light through 90° into the waveguides 128 and 132 respectively. The corner reflectors 126 and 130 also reflect the light passing along the waveguides 128 and 132 respectively back into the laser elements 116 of their respective rows. The reflectors 126 and 130 may be Bragg gratings, directional couplers and bends or any other type of element which will perform the same function.

In each of the rows a phase shifting element 120 is on the substrate surface 114 adjacent an end of each of the laser elements 116 and is optically coupled to the adjacent laser elements 116. Adjacent each of the phase shifting elements 120 is a Bragg reflector 138. The Bragg reflectors 138 in each row are also optically coupled to the laser elements 116 in the row. Each of the Bragg reflectors 138 is of a construction to allow some of the light passing along the row to pass therethrough but reflects a portion of the light in a direction away from the substrate surface 114 so as to emit a beam of light from the laser device 100.

The laser device 100 operates in a manner similar to that previously described with regard to the laser device 10. Light is generated in the waveguide section of each of the laser elements 116 which light flows along the waveguides 122 and 124 to the side edges 118a and 118b. The side edges 118a and 118b reflect the light back into the laser elements 116 thus forming a cavity which generates substantially coherent light. As the light flows along each row, some of the light is emitted by the Bragg reflectors 138 in a direction away from the substrate surface 114 as a beam 134. Since the laser elements 116 in all of the rows are optically coupled in series, the light flows back and forth between the laser elements 116 so that the laser elements 116 are injection locked in phase to each other. This forms a beam of light 134 with a far field which is the interference pattern of the coherent light waves emitted by the Bragg reflectors 138. By electrically operating the phase shifters 120, the interference pattern in the far field may be changed as desired. Since the laser device 100 contains a two dimensional array of the laser elements, phase shifters and Bragg reflectors, the far field interference pattern can be adjusted in two dimensions. Thus, the laser device 100 can provide a relatively high power beam of light having a far field interference pattern which is adjustable in two directions.

Figure 3:
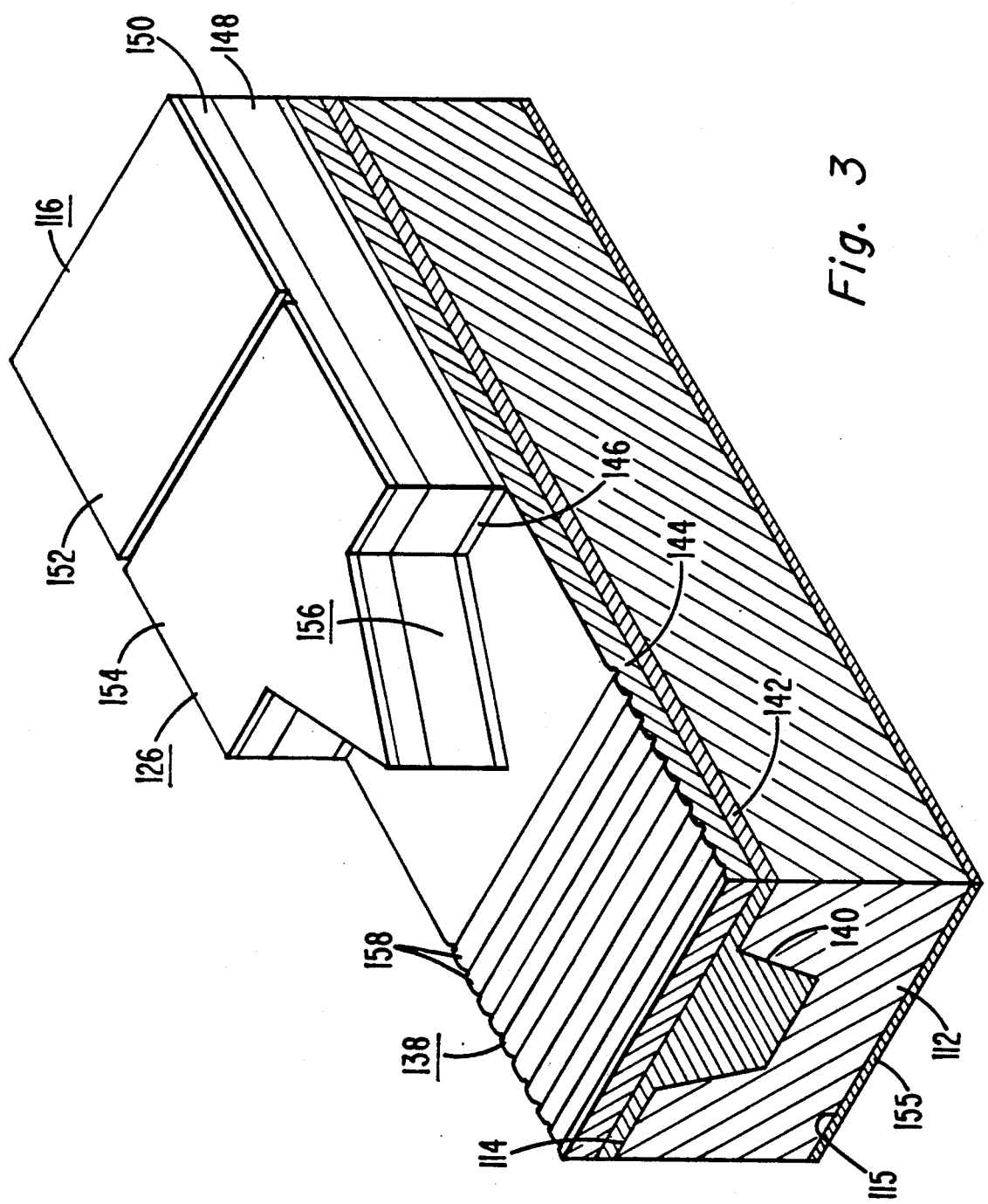
FIG. 3 is a schematic view of another form of the laser device of the present invention for steering the beam of light in two directions.

Referring to FIG. 3, there is shown one form of a portion of the laser device 100. The substrate 112 is a body of single crystalline semiconductor material, such as gallium arsenide, having the one major surface 114 and an opposed major surface 115. The substrate 112 has a channel 140 in the major surface 114 which extends longitudinally along each row of the laser elements 116. A cladding layer 142 is on the surface 114 of the substrate 112 and fills the channels 140. The cladding layer 142 preferably has a substantially smooth surface. The cladding layer 142 is of a semiconductor material preferably of the same conductivity type as that of the substrate 112 but having a higher band gap. For example, the cladding layer 142 may be of N type $Al_xGa_{1-x}As$ where x is less than 1. A waveguide layer 144 is on the cladding layer 142. The waveguide layer 144 is of a semiconductor material having the same conductivity as that of the cladding layer 142 but having a lower band gap. Thus, the waveguide layer 144 may be of N type $Al_yGa_{1-y}As$ where $1 > y < x$. Thus, the waveguide layer 144 has an index of refraction different from that of the substrate 112 and cladding layer 142.

A thin active layer 146 is over the areas of the waveguide layer 144 where the laser elements 116 and the phase shifting elements 120 are to be formed. The active layer 146 is of a semiconductor material of either conductivity type having a band gap lower than that of the waveguide layer 144. Thus, the active layer 146 can be of $Al_zGa_{1-z}As$ where $1>z<y$. A second cladding layer 148 is on the active layer 146. The second cladding layer 148 may be of the same material as the first cladding layer 142 but is of the opposite conductivity type. Thus, the second cladding layer 148 would be of P type $Al_xGa_{1-x}As$. A capping layer 150 is on the second cladding layer 148 and is of a semiconductor material of the same conductivity type as the second cladding layer and of a material which will protect the second cladding layer, such as GaAs. A conductive contact layer 152 is over the portion of the capping layer 150 which forms the laser elements 116, and a conductive contact layer 154 is over the portion of the capping layer 150 which forms the phase shifting element 120. A conductive contact layer 155 is over the opposed major surface 115. The phase shifting element 120 has a tapered transition region 156 projecting therefrom away from the laser element 116 and over and along the longitudinal axis of the channel 140. The transition region 156 is made up of a portion of the active layer 146, second cladding layer 148, capping layer 150 and contact layer 154.

The Bragg reflector 138 is formed in the waveguide layer 144 adjacent the end of the transition region 156 of the phase shifting element 120. The Bragg reflector 126 is a grating formed by a plurality of spaced, parallel grooves 158 in the surface of the waveguide layer 144 which extend transversely across the channel 140. The spacing and depth of the grooves 158 are designed by techniques well known in the art to allow some of the light in the waveguide layer 144 to pass longitudinally through the reflector 138 but to reflect a portion of the light away from the surface of the waveguide layer 144. The reflectors 126 and 130 may be a Bragg grating similar in structure to the reflector 138 except that the grooves 158 are angled to reflect some of the light passing therethrough through 90° along the waveguide layer 142. The waveguides 128 and 132, shown in FIG. 2, may be formed by channels, similar to the channels 140, in the substrate 112 and extending perpendicular to the channels 140 with the waveguide layer 144 filling such channels and extending thereover.

Although the laser elements 116 are shown to be found with a channel for confinement of the light generated therein, the laser elements 116 can be formed of any well-known structure which provides lateral confinement of the light. Also, the laser devices 10 and 100 are shown to have reflecting side edge surfaces for reflecting the light from the laser elements to form the optical cavities in the laser elements. However, other type of reflector means can be used instead of the side edge surfaces, such as Bragg reflectors or the end surfaces of the laser elements themselves. In addition, any type of waveguide structure can be used instead of the channel in the substrate.

I claim:

1. A semiconductor laser device comprising:
 a substrate of semiconductor material having a major surface;
 a plurality of laser elements in spaced relation along said major surface, each of said laser elements having a region which is substantially parallel to said major surface in which radiation is generated and surfaces substantially perpendicular to said region from which at least some of the generated radiation is emitted;
 means along said major surface for optically coupling all of said laser elements in series so as to injection lock the respective phases of all of the laser elements to each other;
 means for emitting a beam of at least some of the generated radiation from the laser elements from a surface of the substrate; and
 respective electrically-adjustable optical phase-shifters, included in the means for optically coupling all of said laser elements in series, after at least some of said laser elements in said series, responding to respective electric signals applied thereto, to control the direction and lobe structure of said emitted beam.

2. A semiconductor laser device comprising:
 a layer of a semiconductor material having an index of refraction different from that of the substrate on said major surface and serving as a waveguide for radiation;
 means along said major surface for confining radiation in the waveguide layer to a number at least one of waveguide paths;
 a plurality of laser elements on said waveguide layer along each of said waveguide paths, each of said layer elements including an active layer of semiconductor material in which radiation is generated, extending along its respective waveguide path and optically coupled to the waveguide layer;
 means along said major surface optically coupling said laser elements in series so as to injection lock the respective phases of all of the laser elements to each other;
 means for emitting a beam of at least some of the generated radiation from the laser elements away from a surface of the substrate; and
 means for varying the phase of the radiation from at least one of said laser elements.

3. A laser device in accordance with claim 1 in which the laser elements and each adjustable optical phase-shifter are arranged in a plurality of rows between opposed side surfaces of the substrate, each row being located along a channel in the major surface of said substrate; a waveguide is included in said means for optically coupling all of said laser elements in series and extends along the major surface of the substrate from each end of each row toward the adjacent side surface; and the waveguides are optically coupled so as to optically couple the laser elements in series.

4. A semiconductor laser device comprising:
 a substrate of semiconductor material having a major surface;
 a plurality of laser elements in spaced relation along said major surface, each of said layer elements having a region which is substantially parallel to said major surface in which radiation is generated and surfaces substantially perpendicular to said region from which at least some of the generated radiation is emitted, said laser elements being arranged in a plurality of rows between a pair of opposed side surfaces of the substrate;

means along said major surface for optically coupling all of said laser elements in series, so as to injection lock the respective phases of all of the laser elements to each other, including a waveguide extending along the major surface of the substrate from each end of each row toward the adjacent side surface, which waveguides are optically coupled so as to couple the laser elements in series by connecting waveguides which extend along the substrate surface to optically connect the laser elements in series;

means for emitting a beam of at least some of the generated radiation from the laser elements from a surface of the substrate; and means for varying the phase of the radiation from at least one of said laser elements.

5. A laser device in accordance with claim 4 including means at the junction of each waveguide and the connecting waveguide to reflect some of the radiation from the waveguide to the connecting waveguides but allow some of the radiation to flow to the side surface of the substrate.

6. A laser device in accordance with claim 5 in which the means for reflecting the radiation from the waveguide to the connecting waveguide is a Bragg grating.

7. A laser device in accordance with claim 5 in which the side surfaces of the substrate are reflecting so that the radiation flowing from the laser elements to the side surfaces is reflected back into the laser elements to form a cavity which generates substantially coherent radiation in the laser elements.

8. A laser device in accordance with claim 7 in which at least one of said side surfaces of the substrate is partially transparent to the radiation so as to emit some of the generated coherent radiation from said side surface at each of said waveguides.

9. A laser device in accordance with claim 4 including a plurality of spaced laser elements along each row with the laser element in each row being optically coupled in series.

10. A laser device in accordance with claim 9 including means adjacent and optically coupled to each laser element for causing some of the radiation generated by the laser element to be emitted as a beam from the major surface of the substrate.

11. A laser device in accordance with claim 10 in which the laser elements in each row are optically coupled to a waveguide and a reflector is in the waveguide adjacent each laser element, said reflector adapted to permit some of the radiation from the laser elements to pass therethrough and reflect some of the radiation away from the substrate surface.

12. A laser device in accordance with claim 11 in which the reflectors are Bragg gratings.

13. A laser device in accordance with claim 11 in which the waveguides at the ends of the rows of laser elements are connected by a connecting waveguide which extends along the substrate surface to optically connect the laser elements in the rows in series.

14. A laser device in accordance with claim 13 including means at the junction of each waveguide at the ends of the rows and a connecting waveguide to reflect some of the radiation from the laser elements to the connecting waveguides but allow some of the radiation to flow to the side surfaces of the substrate.

15. A laser device in accordance with claim 14 in which the side surfaces of the substrate are reflecting so that the radiation flowing from the laser elements to the side surfaces is reflected back into the laser elements to form a cavity which generates substantially coherent radiation in the laser elements.

16. A laser device comprising:
a substrate of a semiconductor material having a major surface and a pair of opposed side surface;
a layer of a semiconductor material having an index of refraction different from that of the substrate on said major surface and serving as a waveguide for radiation;
means along said major surface for confining radiation in the waveguide layer to a plurality of spaced, parallel waveguide paths;
a plurality of laser elements on said waveguide layer with at least one laser element being along each of said waveguide paths, each of said layer elements including an active layer of semiconductor material in which radiation is generated extending along its respective waveguide path and optically coupled to the waveguide layer;
means along said major surface optically coupling said waveguide paths to optically couple said laser elements in series so as to injection lock the respective phases of all of the laser elements to each other;
means for emitting a beam of at lest some of the generated radiation from the laser elements from a surface of the substrate; and
adjusting means formed along said waveguide layer adjacent to at least some of the laser elements for adjusting the phase of the generated radiation in controlled response to respective applied electric signals.

17. A laser device in accordance with claim 16 including means in said waveguide layer at each waveguide path for deflecting some of the radiation out of said waveguide layer away from said major surface of the substrate.

18. A laser device in accordance with claim 17 including a plurality of laser elements formed in said waveguide layer along each of said waveguide paths and means adjacent each of said laser elements for deflecting some of the radiation out of the waveguide layer away from the substrate surface.

19. A laser device in accordance with claim 18 in which each of the means for deflecting the radiation out of the waveguide layer is a grating in the surface of the waveguide layer and extending across the waveguide path.

20. A semiconductor laser device comprising:
a substrate of semiconductor material having a major surface;
a layer of a semiconductor material having an index of refraction different from that of the substrate of said major surface and serving as a waveguide for radiation;
means along said major surface for confining radiation in the waveguide layer to a number at least one of waveguide paths;
a plurality of laser elements on said waveguide layer along each of said waveguide paths, each of said laser elements including an active layer of semiconductor material in which radiation is generated extending along its respective waveguide path and optically coupled to the waveguide layer;
means along said major surface optically coupling said laser elements in series so as to injection lock the respective phases of all of the laser elements to each other; and means for emitting a beam of at least some of the generated radiation from the laser element away from a surface of the substrate in a direction not parallel with any said waveguide path, wherein said mean for emitting a beam includes:

Bragg reflectors interposed between successive laser elements in each said wavelength path.

21. A semiconductor laser device as set forth in claim 20 wherein said number at least one of waveguide paths comprises a plurality of spaced parallel waveguide paths and wherein said means along said major surface optically coupling said laser elements in series includes waveguide paths to complete a continuous serpentine optical path through said spaced parallel waveguide paths.

22. A semiconductor laser device comprising:

a substrate of semiconductor material having a major surface;

a layer of a semiconductor material having an index of refraction different from that of the substrate on said major surface and serving as a waveguide for radiation;

means along said major surface for confining radiation in the waveguide layer to a plurality of spaced parallel waveguide paths;

a plurality of laser elements on said waveguide layer along each of said waveguide paths, each of said laser elements including an active layer of semiconductor material in which radiation is generated extending along its respective waveguide path and optically coupled to the waveguide layer;

means along said major surface optically coupling said laser elements in series so as to injection lock the respective phases of all of the laser elements to each other wherein said means along said major surface optically coupling said laser elements in series includes means for optically coupling ends of said spaced parallel waveguide paths to complete a continuous serpentine optical path through said spaced parallel waveguide paths; and means for emitting a beam of at least some of the generated radiation from the laser element away from a surface of the substrate in a direction not parallel with any said waveguide path.

* * * * *